(12) United States Patent
Morio et al.

(10) Patent No.: US 6,639,226 B2
(45) Date of Patent: Oct. 28, 2003

(54) FOCUSED ION BEAM EQUIPMENT AND FOCUSED ION BEAM PROCESSING METHOD USING SAME

(75) Inventors: Masaru Morio, Kawasaki (JP); Tadaharu Katakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/041,607

(22) Filed: Jan. 10, 2002

(65) Prior Publication Data
US 2003/0001109 A1 Jan. 2, 2003

(30) Foreign Application Priority Data
Jun. 27, 2001 (JP) .......................................... 2001-193958

(51) Int. Cl.[7] ............................................. H01J 37/304
(52) U.S. Cl. ................................. 250/491.1; 250/492.1; 250/492.2; 430/313
(58) Field of Search .................................... 250/492.21

(56) References Cited

U.S. PATENT DOCUMENTS 5,629,137 A * 5/1997 Leedy ........................... 430/315
5,725,995 A * 3/1998 Leedy ........................... 430/315
2001/0010356 A1 * 8/2001 Talbot et al. .................. 250/307
2002/0074494 A1 * 6/2002 Lundquist ..................... 250/307

FOREIGN PATENT DOCUMENTS

| JP | 5-90370 | | 4/1993 |
| JP | 9-283073 | | 10/1997 |
| JP | 09-283073 | * | 10/1997 |
| JP | 10-242437 | | 9/1998 |

* cited by examiner

*Primary Examiner*—John R. Lee
*Assistant Examiner*—James J Leybourne
(74) *Attorney, Agent, or Firm*—Armstrong, Westerman & Hattori, LLP

(57) ABSTRACT

FIB equipment, which irradiates a sample placed on a stage with a focused ion beam (FIB) to perform etching or deposition at the irradiation position, includes an alignment mark formation unit to form an alignment mark by irradiating a periphery of a processing position with the FIB; and a processing position detection unit to superpose an optical microscope image of the area of the processing position at which the alignment mark is formed, and a scanning ion microscope image (SIM image) acquired by FIB irradiation, based on the alignment mark image, and to detect the processing position on the superposed images.

14 Claims, 11 Drawing Sheets

| Alignment mark generation reference table | | |
|---|---|---|
| Observation magnification | Processing area | Alignment mark pattern size |
| 50,000 | 48 μm□ | 4.8 μm□ |
| 100,000 | 24 μm□ | 2.4 μm□ |
| 160,000 | 15 μm□ | 1.5 μm□ |
| 200,000 | 12 μm□ | 1.2 μm□ |
| 300,000 | 8 μm□ | 0.8 μm□ |

80.

112
PAD
112
PAD
110. Chip center pattern
114. Alignment mark pattern

| Pattern formation reference table | | |
|---|---|---|
| Design rule | Pattern size | Interval |
| 0.35 μm | 3.5 μm | 35 μm |
| 0.25 μm | 2.5 μm | 25 μm |
| 0.18 μm | 1.8 μm | 18 μm |
| 0.13 μm | 1.3 μm | 13 μm |

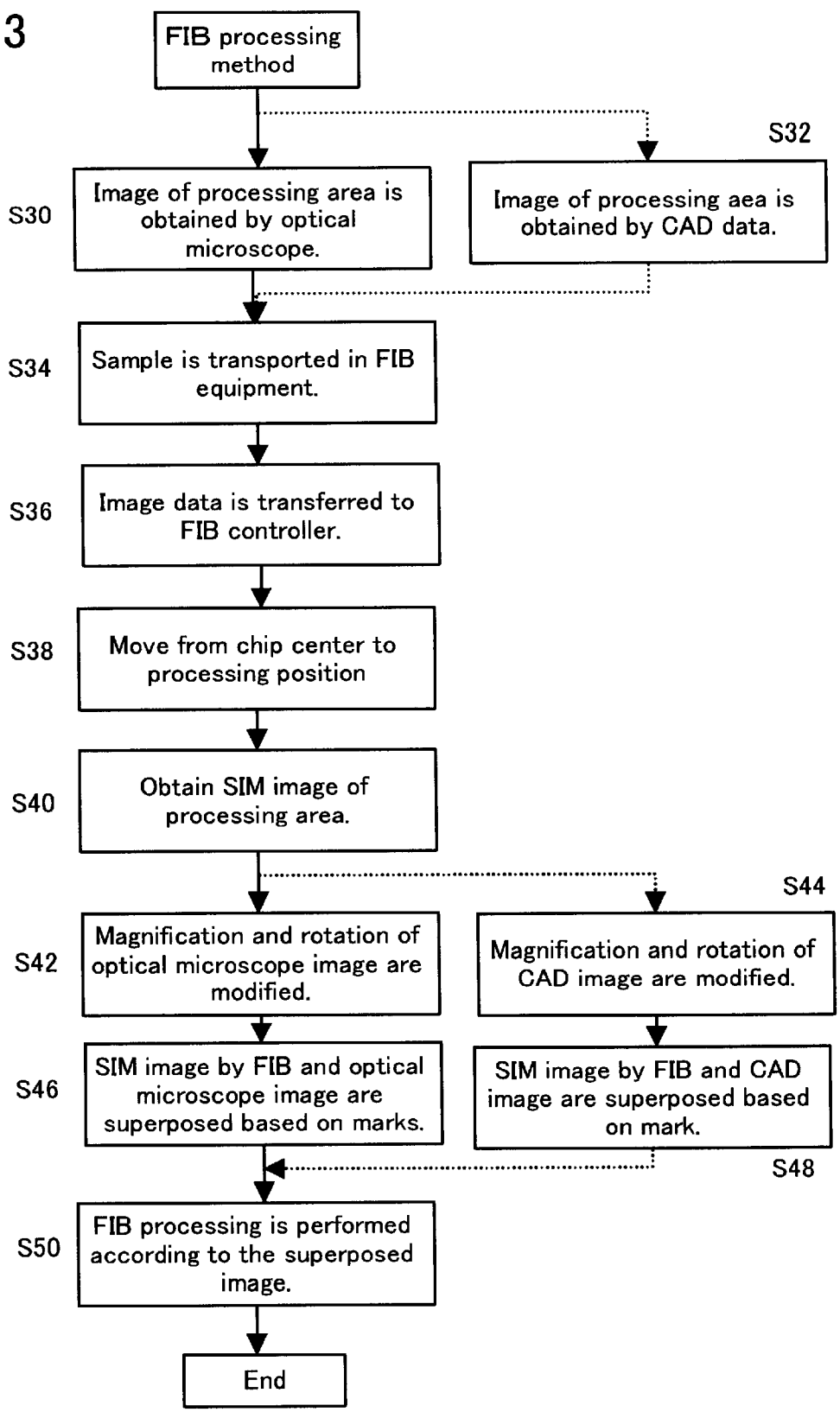

FOCUSED ION BEAM EQUIPMENT AND FOCUSED ION BEAM PROCESSING METHOD USING SAME

BACKGROUND OF THE INVENTION

1. Field of the Invention

The present invention relates to a focused ion beam (FIB) equipment and an FIB processing method using this equipment, and in particular, to FIB equipment and an FIB processing method using this equipment to perform FIB processing of an LSI device having planarized fine multilayer wiring.

2. Description of the Related Art

Previous FIB equipment has been used for, for example, cutting away a prescribed position of an LSI device, to expose a cross-section in order to take scanning electron microscope (SEM) photographs. In such applications, the position of the FIB processing extends over a comparatively broad area, and therefore the precision required for detection of the processing position was not particularly high.

However, in recent years FIB equipment has come to be used to perform partial modification of wiring patterns in LSI devices and other processed samples in an apparatus with high vacuum, by irradiating the wiring pattern with a focused Ga ion beam to perform sputter etching for breaking wiring, or to form new wiring patterns by chemical vapor deposition (CVD) (using an organometallic gas containing tungsten) to connect wires. In order to thus partially break or connect wiring patterns in finely-structured LSI devices, the processing position must be detected with high precision, and FIB irradiation is performed.

On the other hand, planarization of multilayer wiring is generally employed in order to realize still more finely-structured LSI devices. In conventional multilayer wiring, problems occur due to wire-break failures caused by decreased coverage of metallization layers and wire breakage due to electromigration at steps, as step heights increase. Hence, in recent years, by planarizing the interlaminar insulation layers covering wiring patterns, using chemical-mechanical polishing (CMP) methods, and by forming wiring patterns on top, planarization of multilayer wiring structures has been performed.

It is extremely difficult to detect processing positions in such an LSI planarized structure with high precision. In observation of the surface of an LSI device inserted into FIB equipment, the function of a scanning ion microscope (SIM) using the FIB of the equipment is employed, scanning the LSI surface with the beam and detecting the reflected secondary electrons. It is only possible to detect processing positions on the surface by relying on the LSI surface shape detected in this manner. Hence, when no depressions or protrusions exist at the processing position, the processing position cannot be identified from a SIM image.

It has been proposed that the depressions and protrusions of bonding pads normally provided at the edges of a chip be detected by SIM, and that by moving the stage, targeting the coordinates of the processing position, the processing position be detected; but in this case, a wiring pattern position for processing cannot be accurately identified, as a result of stage errors accompanying stage movement.

Further, an image overlay method and a CAD navigation method have been proposed as methods for determining a processing position in FIB processing using conventional FIB equipment. In the image overlay method, an image of the processing position is acquired in advance with an optical microscope; the sample is transported into the FIB equipment; the sample is transported to the processing position coordinates through stage driving; a SIM image there obtained is superposed onto the optical microscope image by adjusting the magnification and rotation; the processing position is detected by relying on the superposed optical microscope image; and FIB processing is performed. The optical microscope can detect not only the surface shape, but also the shape of the lower-layer A1 wiring pattern, and so this method is effective for detection of wiring pattern positions in areas where the surface is planarized. In superposing the SIM image and the optical microscope image, images corresponding to both the depression and protrusions pattern existing on the sample LSI surface are used.

In the CAD navigation method, the stage coordinates of the FIB equipment are linked with the CAD data which is the pattern data of the LSI design data, and by specifying the processing position on the CAD data, the stage automatically moves to the sample processing position. In the above linking process, the CAD data image is superposed onto the SIM image based on bonding pads provided at the edges of the LSI, or on other prescribed patterns.

In the above image overlay method, it is necessary that a topmost-layer protrusion/depression pattern exist near the processing position on the LSI surface. Hence, when no surface protrusion/depression pattern exists over a broad area, the optical microscope image cannot be superposed on the SIM image in the processing area, and so a processing position cannot be detected within this area. In the CAD navigation method, there occurs position shifts resulting from stage precision errors accompanying movement of the stage from the positions of bonding pads provided at the chip edges to a processing position in the chip interior, and in such cases it is difficult to accurately detect the processing position. Moreover, in the CAD navigation method it is also ultimately necessary that the SIM image be superposed on the CAD data image based on a protrusion/depression pattern in the vicinity of the processing position, and so accurate detection of the processing position is difficult in a planarized area with few protrusion/depression patterns.

SUMMARY OF THE INVENTION

One object of the present invention is to provide FIB equipment, and an FIB processing method using same, which can accurately detect an FIB processing position on a planarized sample surface.

Another object of the present invention is to provide an LSI device formation method enabling the accurate detection of FIB processing positions in FIB equipment, and an FIB processing method using same.

In order to achieve the above objects, in a first aspect of this invention, FIB equipment, which irradiates a sample placed on a stage with a focused ion beam (FIB) to perform etching or pattern formation at the irradiation position, comprises an alignment mark formation unit to form an alignment mark by irradiating a periphery of a processing position with the FIB; and a processing position detection unit to superpose an optical microscope image of the area of the processing position at which the alignment mark is formed, and a scanning ion microscope image (SIM image) acquired by FIB irradiation, based on the alignment mark image, and to detect the processing position according to the superposed images.

In the above FIB equipment, even if the surface of the sample to be processed is planarized, a function of the FIB equipment for etching on pattern formation in extremely small areas can be used to automatically form the alignment mark on the planarized surface. Hence, an alignment mark is formed in the area of the processing position, an optical microscope image and SIM image of the area in which the alignment mark is formed are superposed based on the alignment mark, the processing position can be detected with high precision, and such position can be irradiated with an FIB. The alignment mark may be a depression-shape pattern etched by FIB processing, or may be a protrusion-shape pattern formed by FIB processing.

A preferred embodiment of the above invention specifies the processing position and the magnification of the processing area to the automatic alignment mark formation unit, alignment marks are formed in the periphery of the processing position with a size and at an interval which are nearly inversely proportional to the processing magnification. When the processing magnification is low, the shape of the alignment pattern is large, and intervals therebetween are also large; when the processing magnification is high, the alignment pattern shape and intervals therebetween are small in proportion. According to this, alignment marks can be formed on the periphery of the processing area from which a SIM image is acquired, without covering and hiding the pattern for processing.

In order to achieve the above object, in a second aspect of this invention, alignment marks are formed over an entire surface of a covering insulating layer at an uppermost layer of the sample LSI device for processing, at a size and interval chosen according to a design rule. Processing position detection is performed for this LSI device within the FIB equipment. In the processing position detection, a SIM image of the area including the processing position is superposed with an optical microscope image or CAD image, based on the above alignment marks, the processing position is detected, and the position is irradiated with an FIB.

Even if a sample LSI device for processing has a multi-layer wiring structure which has been planarized, by forming alignment marks over the entire surface of the silicon oxide film, silicon nitride film, or other insulating cover film which is the uppermost layer, with size and interval chosen according to the design rule, alignment marks can always be made to exist in the vicinity of the processing position. These alignment marks can be formed simultaneously with the process in which etching removal is performed in the bonding pad area of the insulating cover film of the uppermost layer, or can be formed in an additional etching process thereto. To achieve this, the alignment marks data is added to the CAD data.

Hence, SIM images can be superposed on CAD data images as well as on electron microscope images, relying on the alignment marks. If images can be superposed in the processing area, then the superposed electron microscope image or CAD data image can be used to accurately detect the processing position even when the surface is flat, and FIB irradiation and processing can be performed.

DESCRIPTION OF THE PREFERRED EMBODIMENTS

Below, preferred embodiments of the present invention are explained with reference to the drawings.

Figure 1:
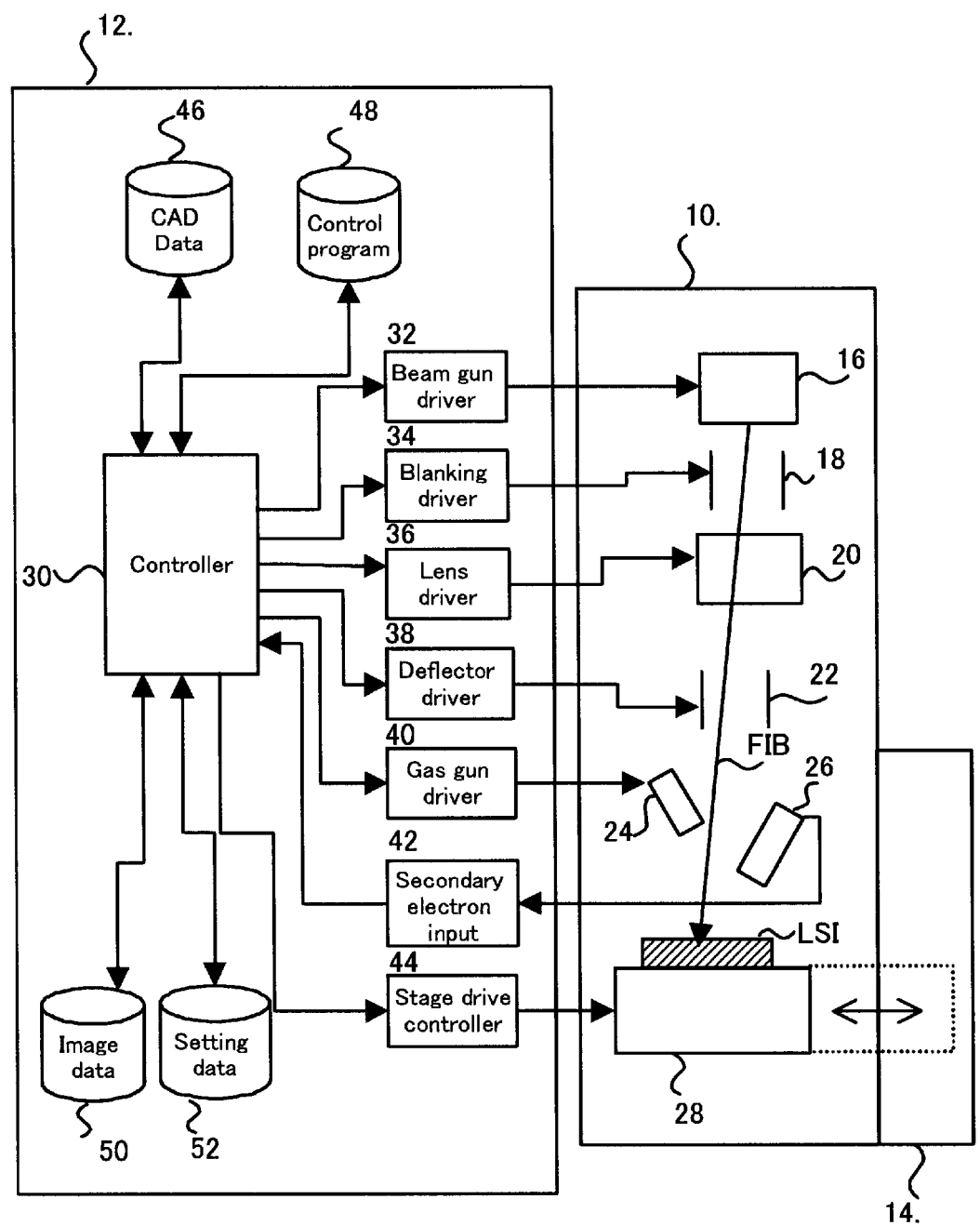
FIG. 1 is an overall schematic diagram of the FIB equipment of an embodiment.

FIG. 1 is an overall schematic diagram of the FIB equipment of an embodiment. In FIG. 1, the FIB equipment has an FIB column 10 which generates the focused ion beam (FIB) and irradiates the surface of the sample for processing with the beam, and a control unit 12 comprising a computer which controls the FIB column. The FIB equipment of this embodiment also has an optical microscope 14 within, or adjacent to, the FIB column 10.

Within the FIB column 10 are provided an ion beam gun 16; a beam blanker 18 comprising a deflector; a focusing lens 20 which focuses the ion beam; a deflector 22 which deflects the beam to a prescribed position to perform scanning; gas generation means 24 to generate gas for use in FIB processing; secondary electron detection means 26 to detect secondary electrons reflected from the LSI device which is the sample for processing; and a stage 28, moveable in the X and Y directions, on which is placed the sample for processing. The stage 28 can move between an optical microscope 14, which uses infrared rays or similar, and the FIB column 10. Hence, an optical microscope image of the sample for processing placed on the stage 28 can be obtained, and, in addition, a SIM image can be obtained from the secondary electrons reflected upon FIB scanning, similarly to conventional methods.

The control unit 12 is one type of computer system, and the controller 30 has a CPU or other computation functions. As a result of command signals from the control 30, the beam gun driving portion 32 drives the ion beam gun 16, the blanking driving portion 34 drives the beam blanker 18, the lens driving portion 36 drives the focusing lens 20, and the deflector driving portion 38 drives the deflector 22. The stage driving control portion 44 also drives the stage driving motor, not shown, according to command signals from the controller. Detection signals from the secondary electron detection means 26 are input to the secondary electron input portion 42 and supplied to the controller 30.

The control unit 12, by executing a control program 48, automatically forms alignment marks on the surface of the LSI device for FIB processing, and automatically performs FIB processing at the specified processing position. A settings file 52 in which are stored settings, described below, an image data file 50 in which are stored optical microscope images and SIM images, and a CAD data file 46 in which are stored design data for the LSI device, can be accessed by the controller 30 for this purpose.

Figure 2:
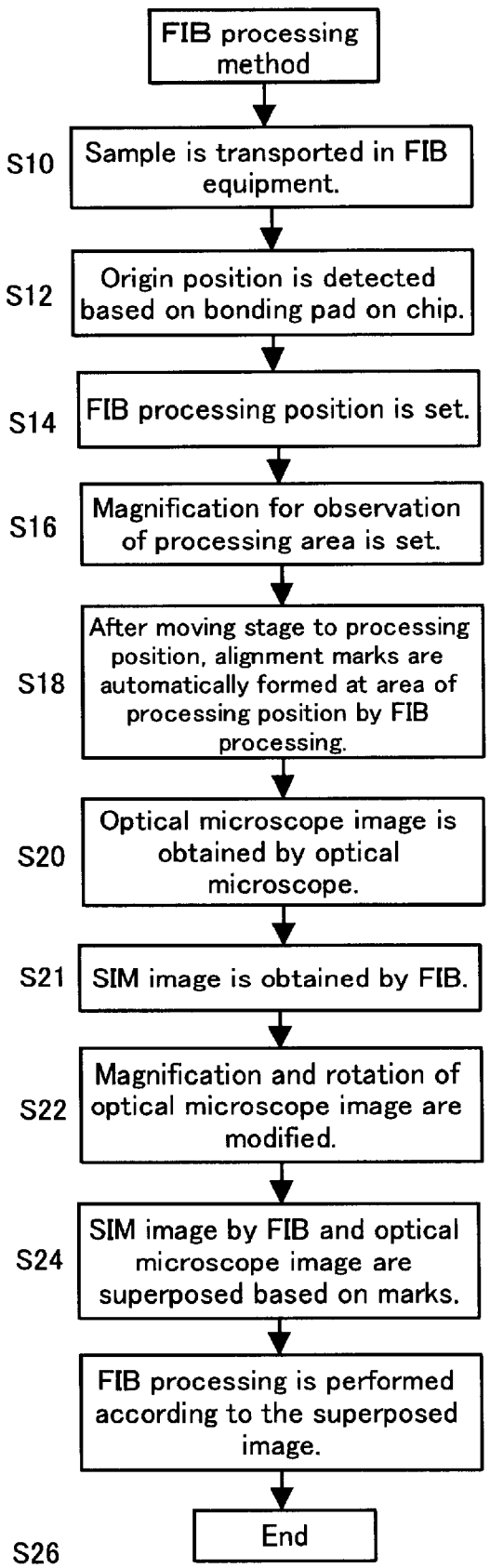
FIG. 2 is a flowchart of the FIB processing method of the embodiment.

FIG. 2 is a flowchart of the FIB processing method of this embodiment. Below, the FIB equipment of this embodiment, and the FIB processing method using this equipment, are explained by referring to FIG. 2. First, the LSI device which is the sample for processing is placed on the stage 28 in the FIB equipment (S10).

Figure 3A:
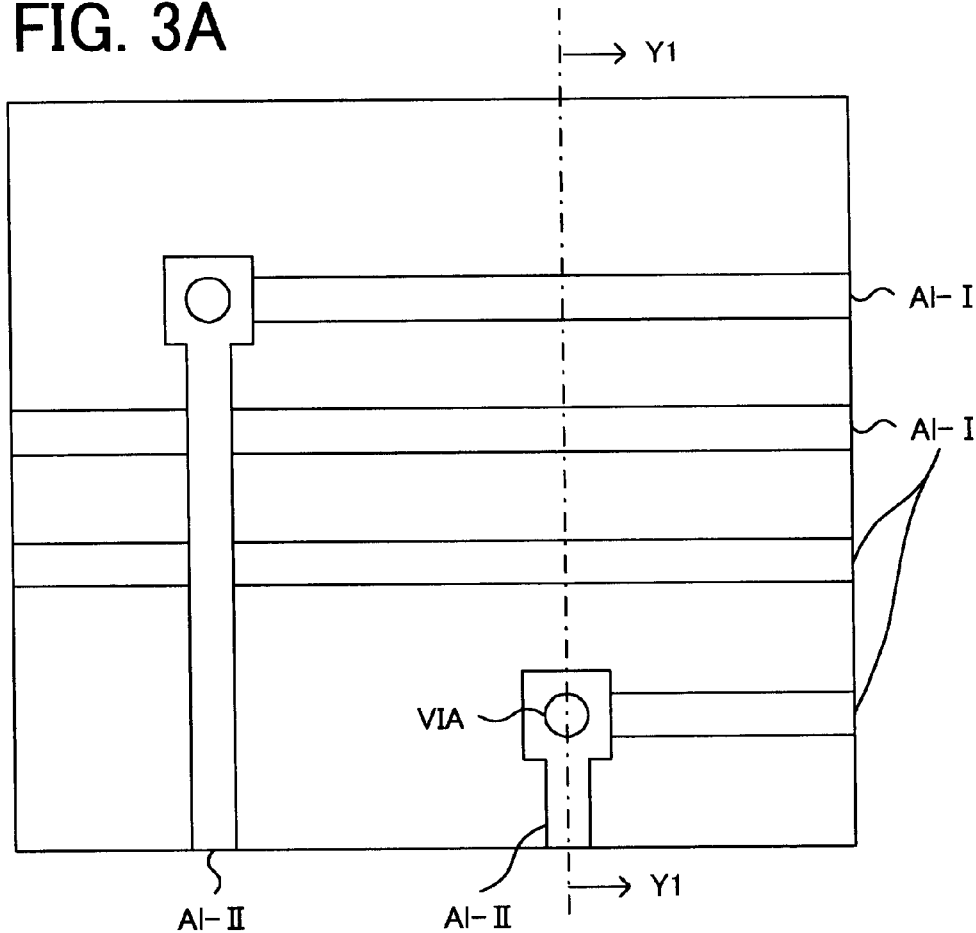
FIG. 3 is a plan view and cross-sectional view showing one example of an LSI device which is the sample for processing.
Figure 3B:
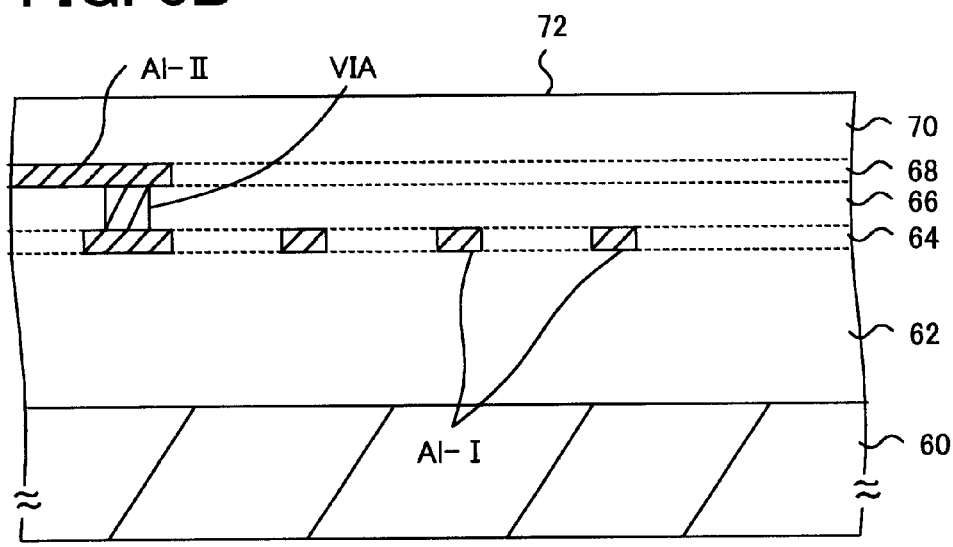

FIG. 3 is a plan view and cross-sectional view showing one example of an LSI device which is the sample for processing. FIG. 3A is a plan view, and FIG. 3B is a cross-sectional view along line X1–Y1; on the surface of the silicon semiconductor substrate 60 are formed an insulating film 62, a first wiring layer A1-I, interlaminar insulating films 64, 66, a second wiring layer A1-II, a second interlaminar insulating film 68, and a cover insulating film 70. The first wiring pattern A1-I is formed in the horizontal direction in the plane view of FIG. 3A; the second wiring pattern A1-II is formed in the vertical direction, and these are connected as appropriate through via holes VIA to form the multilayer wiring structure. On the second wiring pattern is formed a third wiring pattern, not shown, and an interlaminar insulating film is formed here also, but the third wiring pattern does not exist in the area of FIG. 3. After formation of the second wiring pattern, the interlaminar insulating film 68 is flattened by a planarization process. Hence, if the third wiring pattern is not formed, the surface of the cover film 70 is planarized, as shown.

If the surface is planarized, then the SIM image of the area shown in FIG. 3A becomes a completely black image, with no changes in the secondary electrons reflected from the surface accompanying FIB irradiation. On the other hand, in the optical microscope image of the area, the wiring patterns below the cover insulating film 70 can also be detected. However, there are no marks serving as criteria for superposition of the two images, and so superposition is not possible.

Figure 4:
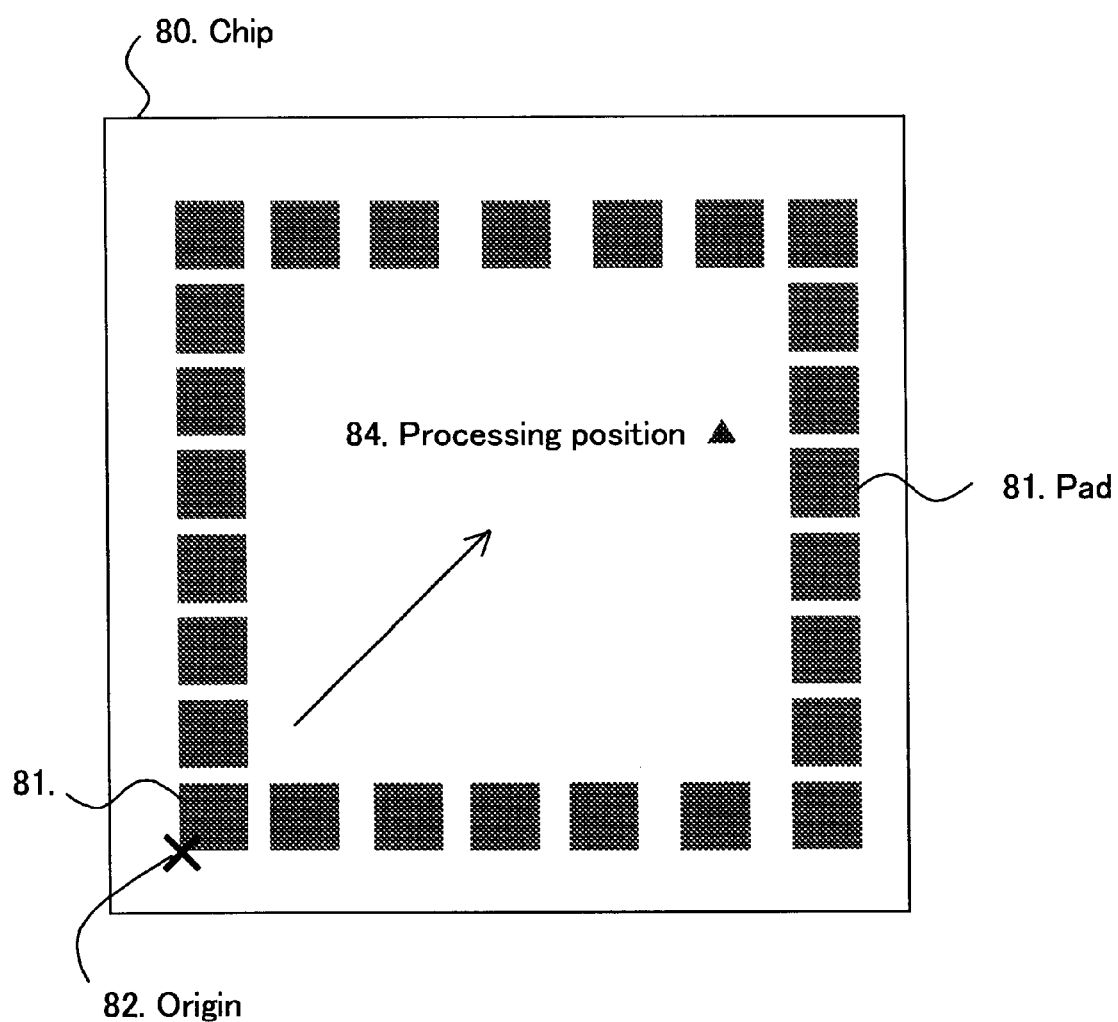
FIG. 4 is a figure showing the overall chip.

Returning to FIG. 2, the origin position on the LSI device, placed on the stage 38 within the FIB column 10, is detected based on bonding pads provided at the chip surface by an exposure process of photo-lithography (S12). FIG. 4 is a figure showing the overall chip. In the vicinity of the LSI chip 80 are provided a plurality of bonding pads 81. Of these pads 81, a corner of one pad 81 is defined as the chip origin, and this origin 82 is detected from a SIM image obtained by FIB scanning. The interrelation between the stage coordinate system and the chip origin is then identified. As a result, stage movement can be employed to move to the processing position 84 within the chip 80.

When the origin position on the chip is detected, and the interrelation between the stage coordinate system and the chip coordinate system has been identified, FIB processing positions are set (S14) and the magnification for observation of the processing area is set (S16) by the operator. These settings are initial settings which are necessary for formation of alignment marks on the periphery of the processing position. The settings data necessary for these settings is stored in the settings data file 52.

When the above FIB processing position settings and observation magnification settings are made, the controller 30 moves the stage 38 via the stage driving control portion 44, to move the processing position 84 on the chip 80 within the observation area of the FIB column. The controller 30 then uses FIB processing to automatically form a pattern of alignment marks determined by the previously set observation magnification (S18). If the FIB processing employs the CVD method, the alignment marks are a pattern of protrusions formed on the LSI device surface; if the FIB processing employs the sputter etching method, the alignment marks are a pattern of depressions formed in the LSI device surface.

Figures 5, 6:
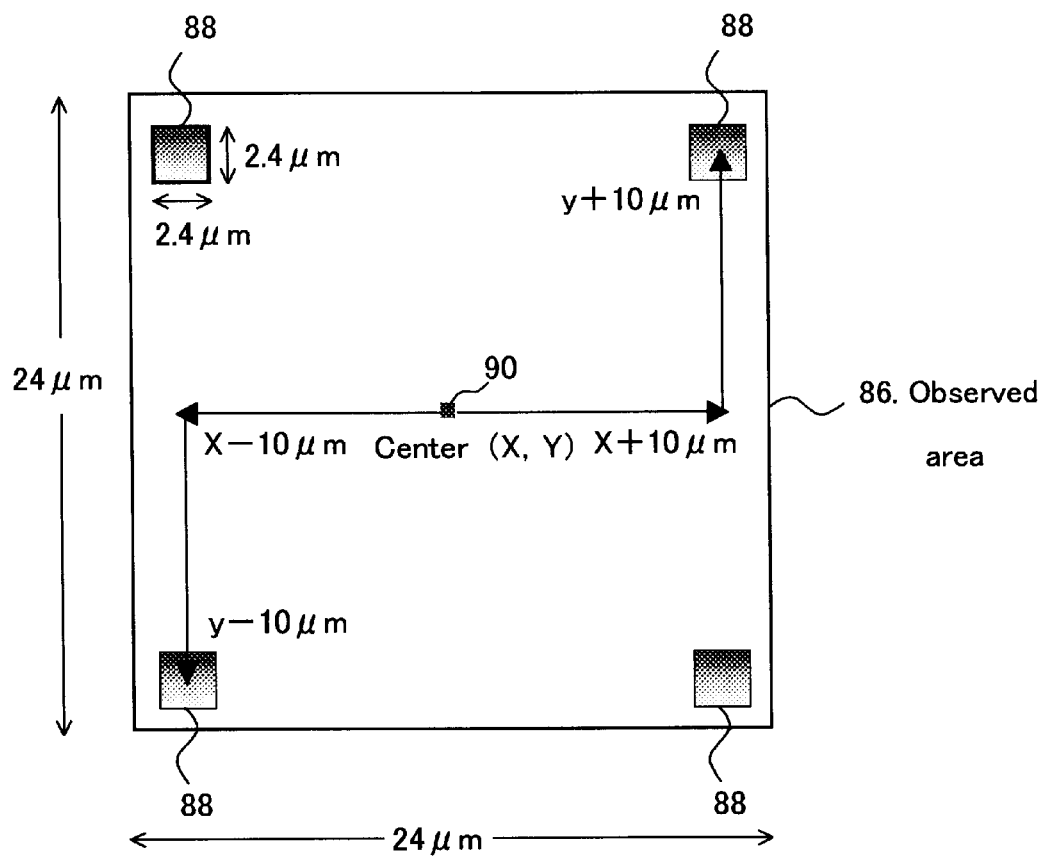
FIG. 5 is a figure which explains the automatic formation of alignment marks, formed on the periphery of the processing position within the observed area.
FIG. 6 is a table showing the relation between the observation magnification and the alignment mark size in automatic formation of alignment marks.

FIG. 5 is a figure which explains the automatic formation of alignment marks, formed on the periphery of the processing position within the observed area. FIG. 6 is a table showing the relation between the observation magnification and the alignment mark size in automatic formation of alignment marks. The center (X,Y) of the processing position within the chip as set in the above process S14 becomes the center 90 of the observed area 86; and the size of the alignment marks is defined uniquely by the settings of the table of FIG. 6, according to the observation magnification set in the process S16. For example, if the observation magnification is set to 100,000 times, then the processing area which is the observation area is set to 24 mm square, and the size of the alignment marks is set to 2.4 mm square.

As shown in FIG. 5, this is accompanied by the formation of a rectangular pattern 88 of alignment marks, in the four corners at ±10 mm above and below the center 90 of the observation area 86. The observation magnification depends on the fineness of the design of the LSI device which is the sample for processing, and corresponds to the design rule. If the device structure is very fine, the observation magnification is also set high; if the device structure is not very fine, the observation magnification is set low. Further, it is preferable that the pattern size of the alignment marks 88 be set to approximately 1/10 the processing area 86, which is the observation area. In this way, by setting the observation magnification according to the LSI design rule, a pattern 88 of alignment marks can be formed which does not cover the wiring pattern within the observation area which is to be subjected to FIB processing. This is because, if the pattern of alignment marks overlaps with the wiring pattern to be processed, FIB processing becomes difficult.

As shown in FIG. 6, if the observation magnification is low (in cases where the design rule is not so fine), the observation area (processing area) is large in size, and consequently the alignment marks are also larger in size. On the other hand, if the observation magnification is high (in cases where the design rule is fine), the observation area (processing area) is small in size, and so the alignment marks are also smaller in size. The sizes of the observation area and alignment marks are substantially in inverse proportion to the observation magnification.

In process S18, the controller 30 moves the stage 38 according to the previously set processing position and processing area observation magnification, such that the processing position center 90 is positioned within the observation area, and the controller 30 then uses the deflector 22 to deflect the FIB, to form at least three alignment marks 88 in the four corners of the processing area 86.

Figure 7A:
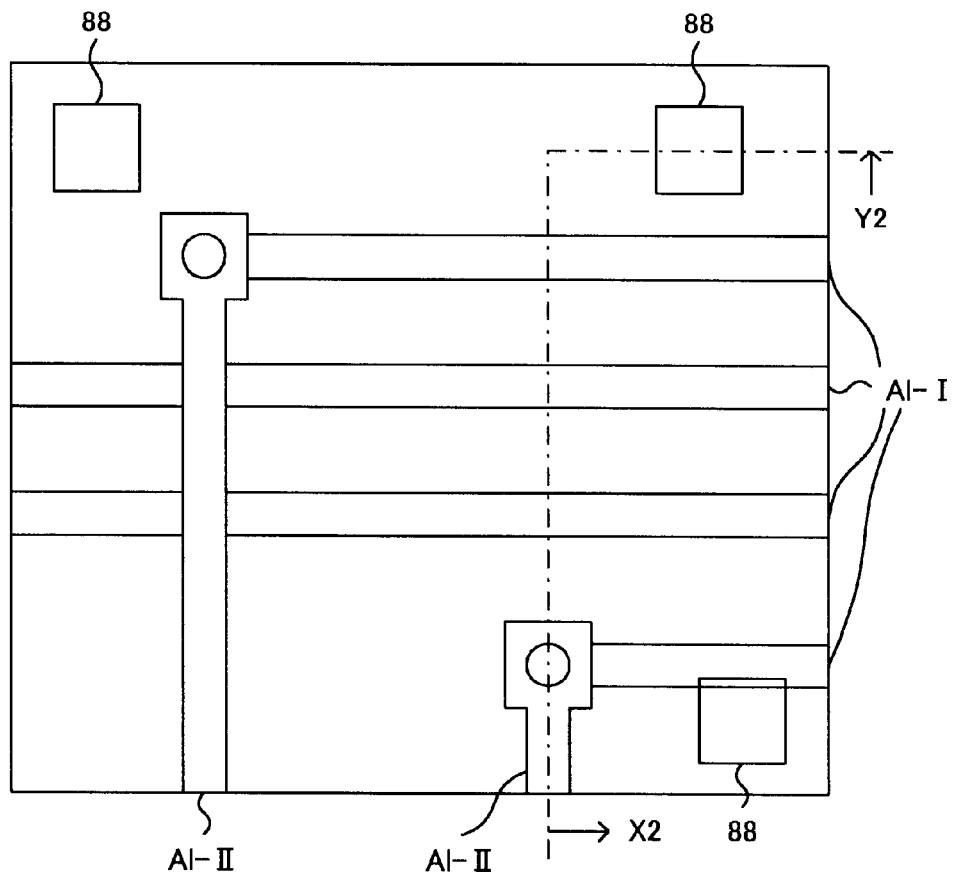
FIG. 7 is a figure showing an LSI device in a state in which alignment marks are formed.
Figure 7B:
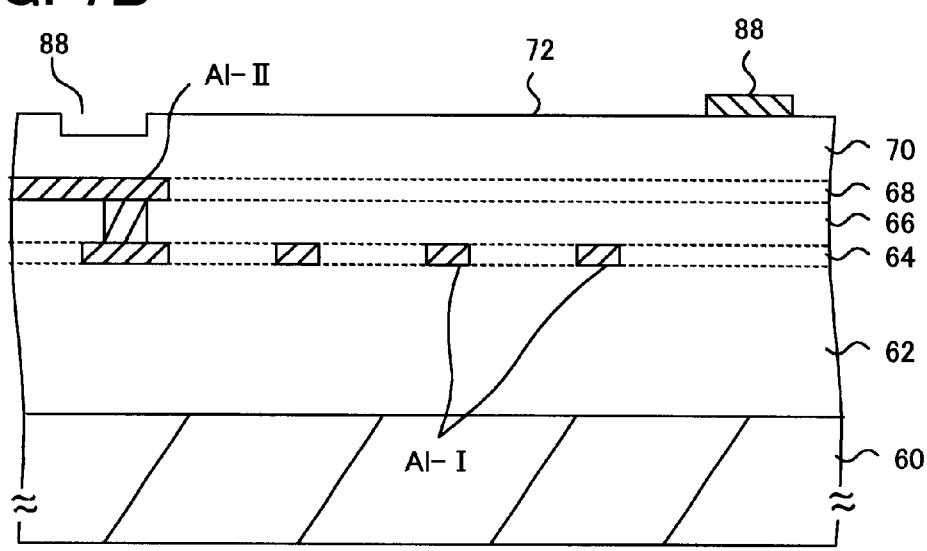

FIG. 7 is a figure showing an LSI device in a state in which alignment marks are formed. Like FIG. 3, FIG. 7 shows a plan view in A, and a cross-sectional view in B. FIG. 7B shows a cross-sectional view along the X2–Y2 line in FIG. 7A.

As indicated on the right in FIG. 7B, protrusion-shaped alignment marks 88 are formed on the flat surface 72 of the LSI device. In the case of such protrusion shapes, by performing FIB irradiation in an organometallic gas atmosphere containing tungsten, such alignment marks 88 can be formed by CVD. Or, the alignment marks 88 may be depression-shaped, as shown on the left side of FIG. 7B. In this case, by performing FIB irradiation in an etching gas atmosphere, the alignment marks 88 are formed by sputter etching.

Returning to FIG. 2, when the process to form a pattern of alignment marks (S18) ends, the controller 30 moves the stage 38 so that the LSI device is moved to the side of the optical microscope 14, and acquires an optical microscope image (S20). The optical microscope 14 acquires an image by, for example, scanning the LSI device with an infrared beam, and detecting the transmitted light with an infrared image pickup element. The image is digitized, put into a form in which enlargement, reduction and rotation are possible, and stores the image in the image data file 50. Even if the surface is flat, the optical microscope image can include the surface pattern and the wiring pattern below the cover insulating film 70.

The controller 30 drives the stage 38 to move the LSI device into the FIB column 10, such that the processing area center 90 is positioned at the center of the FIB column. Then, the controller 30 scans the processing area with the FIB, and acquires a SIM image from the reflected secondary electrons (S21). At this time, protrusion-shaped or depression-shaped alignment marks 88 have been formed on the LSI device surface, so that the SIM image necessarily includes images of the alignment marks 88. This SIM image is also stored in the image data file 50.

Figure 8B:
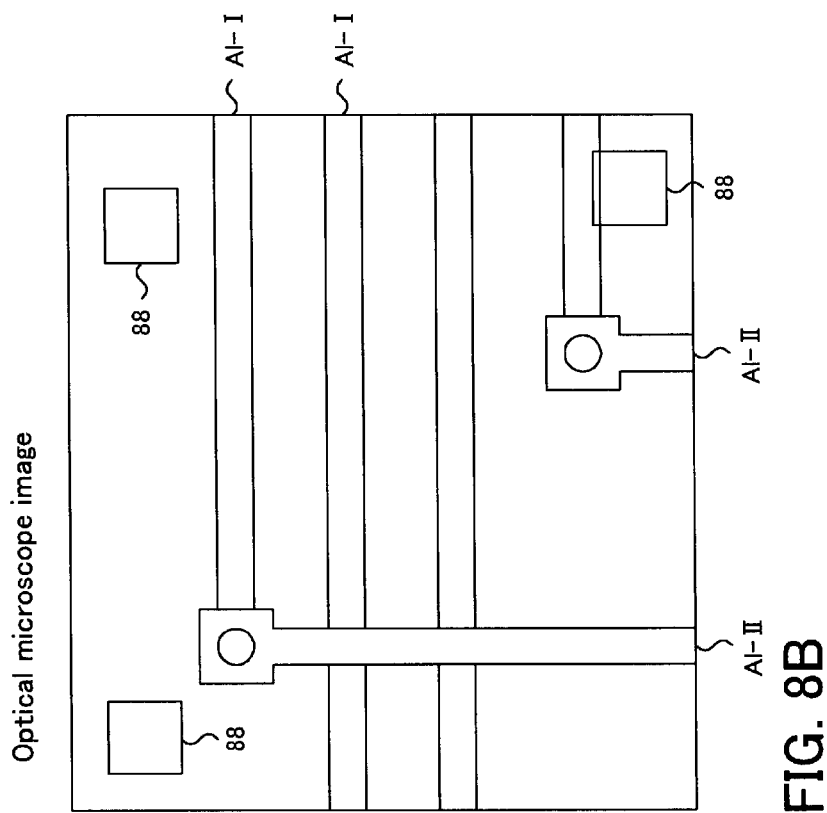
FIG. 8 is a figure showing a SIM image and an optical microscope image.
Figure 8A:
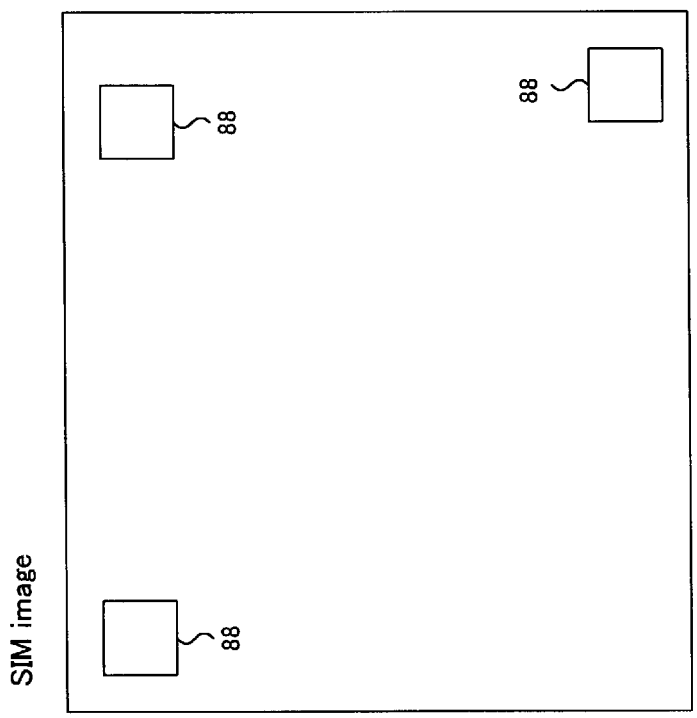

FIG. 8 is a figure showing a SIM image and an optical microscope image. FIG. 8A is an SIM image; alignment marks 88 have already been formed on the LSI device surface, so that an image of the alignment pattern 88 is included in the SIM image obtained by FIB scanning. In an actual SIM image, this alignment pattern 88 is perceived as a somewhat indistinct image.

FIG. 8B is an optical microscope image. This is an image of the LSI device shown in FIG. 7, and includes an image of the alignment marks 88 formed on the surface, and an image of the first wiring pattern A1-I and the second wiring pattern A1-II.

At this time, enlargement and reduction of the magnification, and modification of the rotation, of the optical microscope image is performed, to adjust the optical microscope image such that superposition on the SIM image is possible (S22). The two images are then superposed, based on the alignment marks 88 (S24). The superposed images may become as in FIG. 8B, for example.

The controller 30 has identified the position of the alignment marks 88 in the coordinate system of the FIB equipment, and so by superposing the optical microscope image on the FIB image based on the alignment marks, the position of the wiring pattern in the FIB coordinate system can be easily detected. Finally, the controller 30 performs FIB irradiation at the processing position in accordance with the superposed images, in order to perform the required FIB processing (S26). This FIB processing can, according to the processing details, be performed automatically, by creating an appropriate program and causing the processing program to be executed by the controller 30.

Figure 9A:
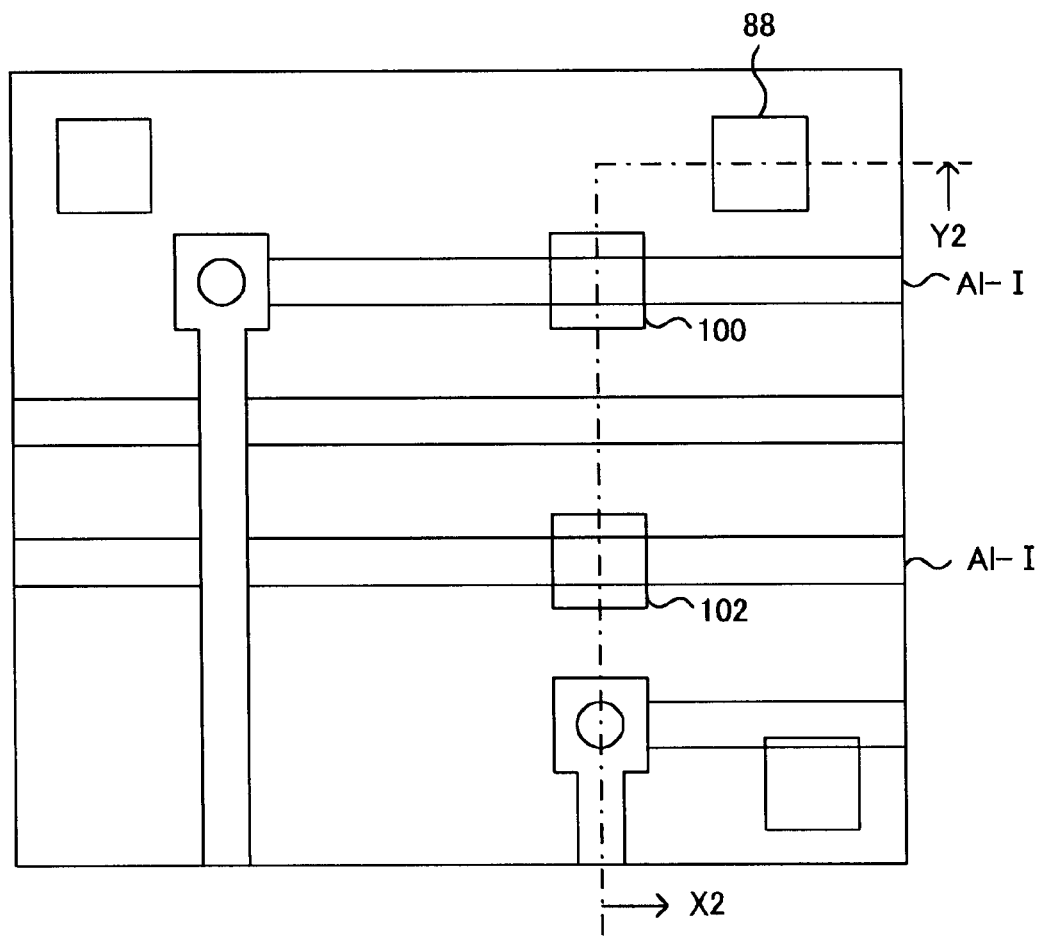
FIG. 9 is a figure showing an example of a FIB processing process.
Figure 9B:
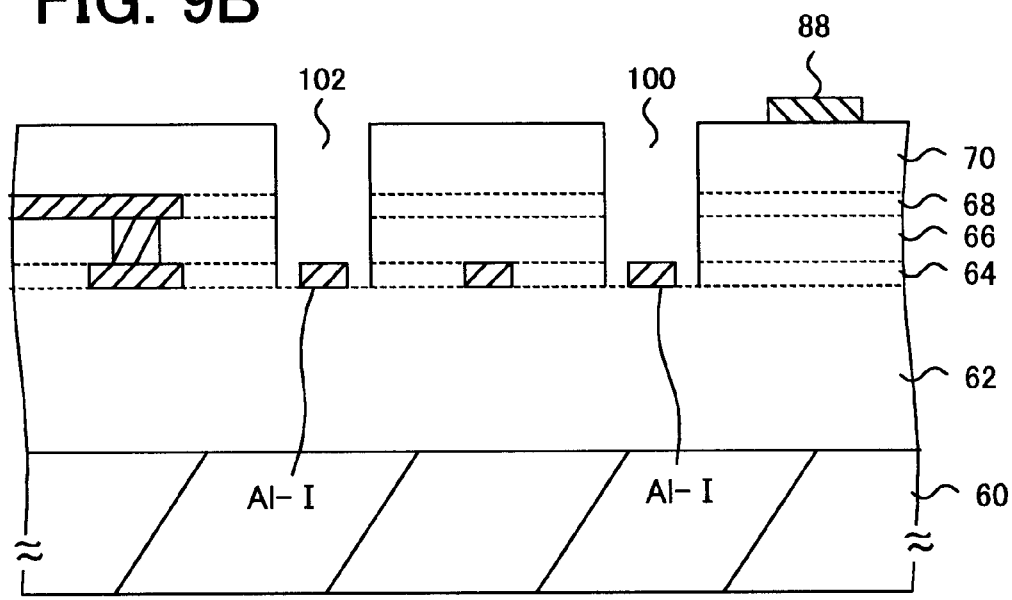
Figure 10A:
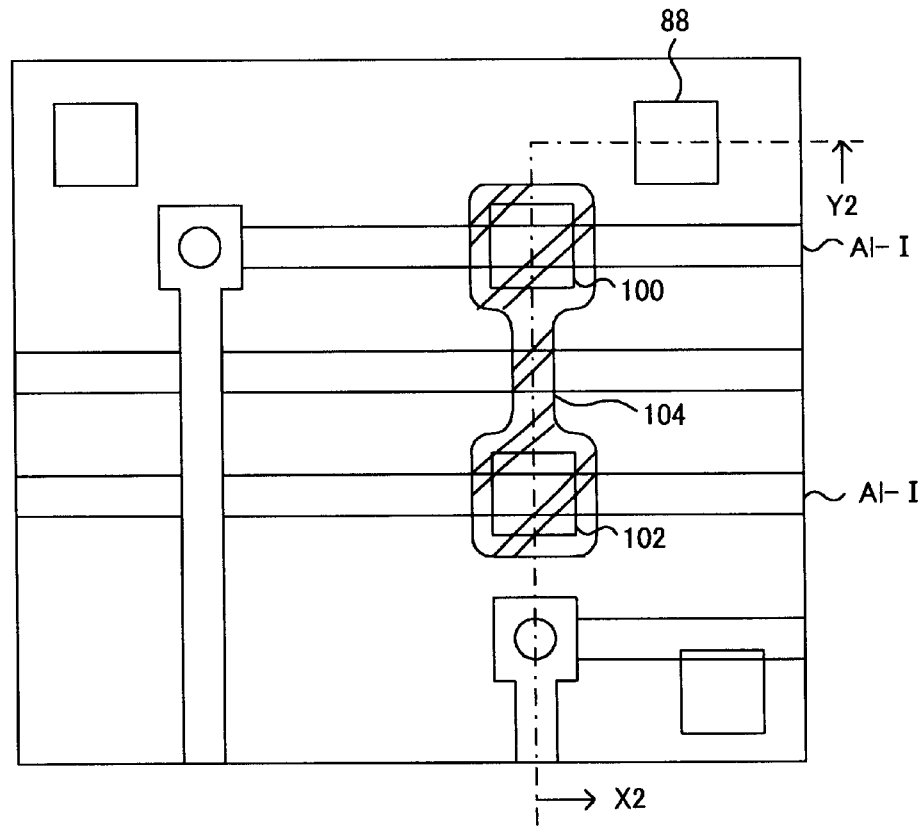
FIG. 10 is a figure showing an example of a FIB processing process.
Figure 10B:
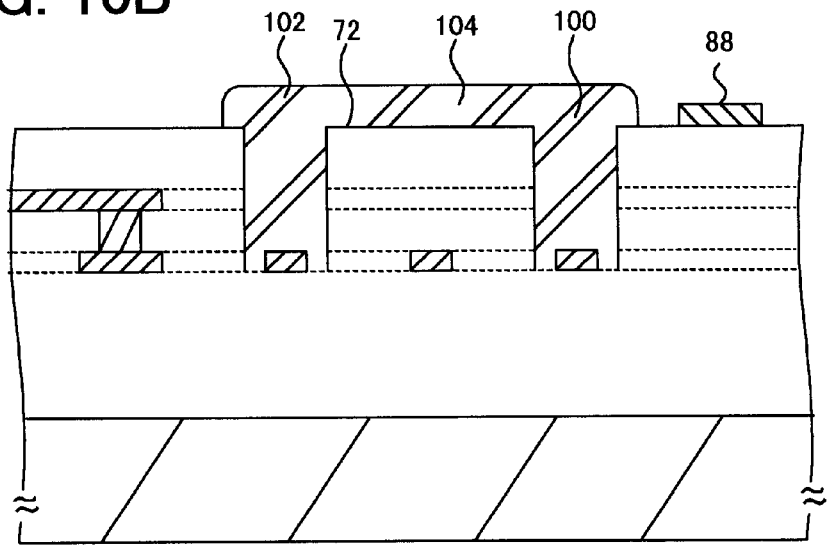

FIG. 9 and FIG. 10 are figures showing an example of FIB processing. In both figures, A is a plan view, and B is a cross-sectional view along the X2–Y2 line. In this example, FIB processing is performed to connect a first wiring pattern A1-I uppermost in the figure with a second wiring pattern A1-I lower in the figure. First, as shown in FIG. 9, through sputter etching using FIB irradiation, the insulating films 70, 68, 66, 64 are removed, and exposure holes 100, 102 are formed which expose part of the wiring patterns A1-I. The controller 30 drives the deflector 22 to irradiate the areas 100, 102 with the FIB, forming the exposure holes 100, 102. At this time, the FIB irradiation position is detected using the above superposed images.

Next, a connecting pattern 104 containing tungsten is formed in the exposure holes 100, 102 and on the surface 72 connecting therebetween, as shown in FIG. 10. That is, the controller 30 drives the deflector 22 to irradiate with an FIB the exposure holes 100 and 102 and the surface 72 connecting therebetween, while supplying an organometallic gas for CVD from a gas gun 24, so that a connecting pattern 104 can be formed. This FIB irradiation position is also detected using the above superposed images.

Next, the FIB processing method of a second embodiment is explained. In the first embodiment above, the FIB processing functions originally possessed by the FIB equipment were used to form alignment marks in the processing area, and based on this a SIM image acquired by FIB and an optical microscope image were superposed, enabling detection of the processing position in a planarized area of the surface. In the second embodiment, at the end of the LSI device manufacturing process, the cover insulating film is etched to form alignment marks on the entire surface of the chip. Even if planarization technology is adopted in a multilayer wiring structure together with this, because alignment marks with a depressed or protruding shape are formed in the surface in the final process, it is possible to later superpose a FIB image and an optical microscope image, or a CAD data image, for FIB processing.

Figures 11, 12:
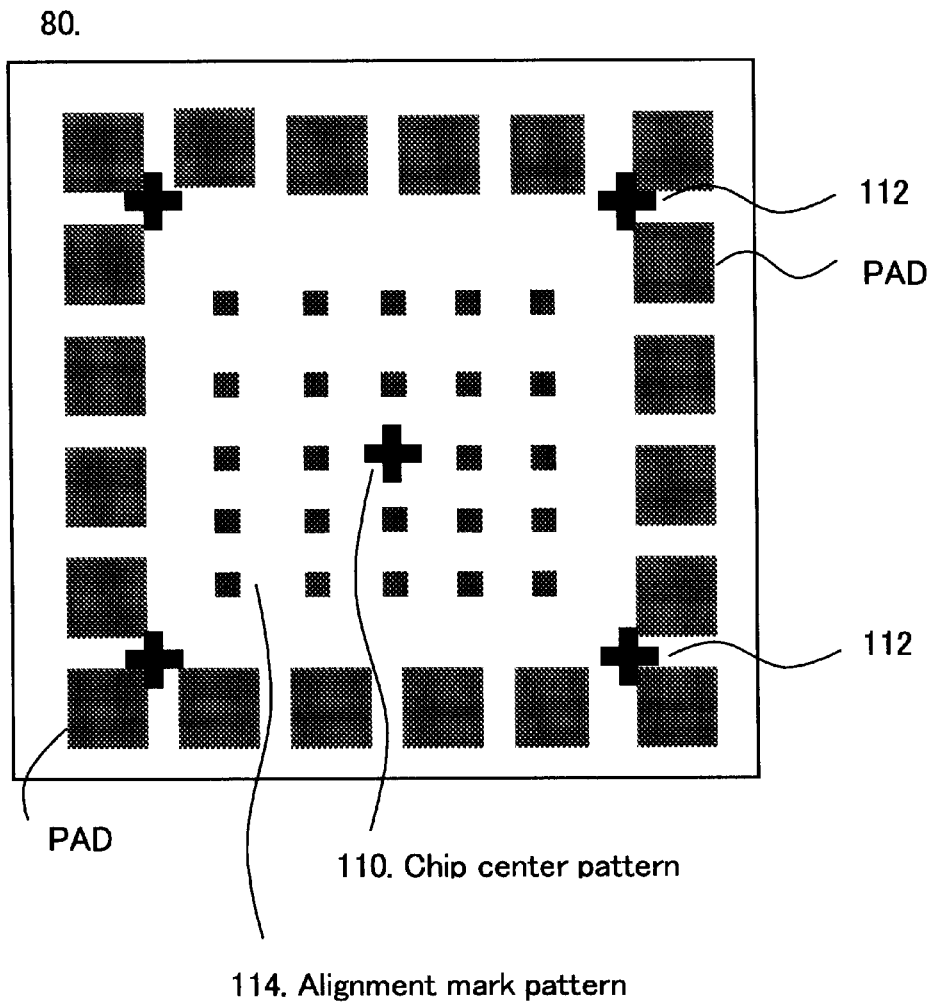
FIG. 11 is a figure showing an example of alignment marks formed on a chip according to a second embodiment.
FIG. 12 is a table showing the relation between the size and interval of alignment marks, and the design rule; and, FIG. 13 is a flowchart of the FIB processing method of the second embodiment.

FIG. 11 is a figure showing an example of alignment marks formed on a chip in the second embodiment. In the vicinity of the chip 80 are formed a plurality of bonding pads PAD. In this embodiment, however, a matrix-shape alignment pattern 114 is formed regularly over the entirety of the area inside the bonding pads. It is preferable that the shape of this pattern be rectangular, in order to reduce the amount of CAD data. However, the alignment pattern 114 may also be a lattice-shape pattern.

As shown in FIG. 11, a chip center pattern 110 is also formed at the center of the chip 80. In the CAD data, the pattern data is normally defined with the chip center as the origin. Hence when a chip center pattern 110 is formed, the number of processes performed for moving to the processing position by stage movement can be reduced, because of the same coordinate systems in the CAD data and in the chip. Also, it is preferable that, for example, a cross shape be adopted as the chip center pattern 110 for purposes of discrimination from the alignment pattern 114. In order to impart versatility, reference patterns 112 are also formed on the inside of the pads PAD at the four corners of the chip 80, to make the movement to processing positions easy.

FIG. 12 is a table showing the relation between the size and interval of alignment marks, and the design rule. The size and placement interval of the alignment pattern 114 in the second embodiment are set according to the design rule. As shown in the table of FIG. 12, when the design rule is 0.35 mm (when the minimum pattern size is 0.35 mm), the size of the alignment pattern 114 is set to 3.5 mm square, and the placement interval between patterns is set to 35 mm. Hence the patterns 114 are formed with approximately 50 minimum-placement patterns formed between neighboring alignment patterns 114. As the design rule is made still finer, the size of the alignment patterns 114 is made still smaller, and the placement interval is made narrower.

The size and interval of these alignment patterns are determined by an approach similar to that of the first embodiment. That is, if the device structure is not very fine, the size and placement interval of alignment patterns is large; if the device structure is made more fine, the size and placement interval of the alignment patterns are reduced. As a result, alignment patterns 114 will reliably exist in the processing area, and moreover the possibility that alignment patterns 114 cover the pattern for processing is reduced.

FIG. 13 is a flowchart of the FIB processing method of the second embodiment. Before explaining this flowchart, the method of manufacture of LSI devices in the second embodiment is explained. At the end of the LSI device manufacture processes, after the cover insulating film has been formed, there is an etching process to remove the cover insulating film on the pad areas. In this embodiment, after this process to etch the pad areas, an exposure process and an etching process are added to form the alignment patterns 114 and the chip center pattern 110, as shown in FIG. 11. That is, an exposure mask is used which is formed from CAD data having the alignment patterns 114 and chip center pattern 110, the resist on the cover insulating film is exposed, and the cover film is partially removed by a prescribed etching process. By this means, a depression-shape pattern shown in the cross-sectional view of FIG. 7 is formed.

Returning to FIG. 13, first an optical microscope image of the surface of the LSI device that is the sample for processing is acquired (S30). This image data is stored in storage means and saved. Next, the LSI device which is the sample for processing is transported into the FIB equipment, and placed on the stage 38 (S34). Then the optical microscope image data is transferred to the control unit 12 of the FIB equipment, and stored in an image data file 56 (S36). This data transfer may also be performed before the LSI device transport.

The controller 30 then drives the stage, and moves from the chip center pattern 110 of the LSI device to the processing position (S38). In this movement, because a chip center pattern 110 has been formed in advance at the center of the LSI chip, the chip center pattern 110 can be identified from a SIM image acquired by FIB scanning. Hence using CAD data defined in terms of the chip center, stage movement to the processing position coordinates can be performed using few processes. When moving the stage based on the positions of pads on the chip periphery, it is necessary to first convert the coordinates of the CAD data, which take the chip center as the origin, into a new coordinate system with a pad position as the origin, and so processes become more complex.

Then, the controller 30 performs FIB scanning and detects reflected secondary electrons to acquire a SIM image of the processing area, including the processing position (S40). The magnification and rotation of the previously acquired optical microscope image are then adjusted such that there is agreement with the SIM image (S42). With this, the SIM image and the optical microscope image both become images containing alignment patterns, similarly to the case shown in FIG. 8. Hence, the two images can easily be superposed, based on the alignment pattern (S46).

Finally, the controller 30 identifies the FIB processing position according to the superposed images, and can break or connect a wiring pattern (S50) by performing FIB irradiation at this position. The method of connection of wiring patterns is as shown in FIG. 9 and FIG. 10. Breaking a wiring pattern is possible by performing FIB irradiation and introducing etching gas, so that sputter etching of only the FIB-irradiated area is possible.

In the second embodiment, CAD data is used to form alignment patterns on the surface of the LSI pattern. Hence, in order to identify the FIB processing position, superposition of a CAD data image and a SIM image is also possible. In this case, as shown in FIG. 13, process S32 is executed in place of process S30, and processes S44 and S48 are executed in place of processes S42 and S46. Registration mark patterns also exist in the CAD data, and so superposition of a CAD data image and an FIB image is also possible.

A prior art example related to the second embodiment is disclosed in Japanese Patent Laid-open No. H5-90370. In this prior art example is described the formation of a lattice-shape depression/protrusion pattern for alignment on the chip surface, and detection of a position for FIB processing based on this. However, there is no description of the setting of the size and interval of the depression/protrusion pattern for alignment according to the design rule. Further, there is no description of the superposition of an optical microscope image or CAD data image with an FIB image based on this depression/protrusion pattern for alignment, or of detection of a processing position based on the superposed images.

As has been described, in the second embodiment, merely by adding a process in which, in the final manufacturing process, alignment mark patterns are formed on an LSI surface which has been planarized, in the subsequent FIB processing, the processing position can easily be detected. FIB processing is generally used not with mass-produced items, but with trial items and other devices to change part of the circuit; addition of the manufacturing process in question is mainly necessary for trial items, and does not result in increased costs for mass-produced items.

Thus by means of this invention, detection of a processing position can be performed with high precision even for LSI devices and other processing samples with a planarized surface, enabling FIB processing of fine patterns.

The scope of the present invention is not limited to the foregoing embodiments, but extends to the scope of the appended clams and equivalents thereof.

What is claimed is:

1. Focused ion beam (FIB) equipment, which irradiates a sample placed on a stage with an FIB, and performs etching or deposition at the irradiation position, comprising:
    an alignment mark formation unit, which forms an alignment mark on the surface of said sample by irradiating a periphery of a processing position with an FIB; and,
    a processing position detection unit, which superposes an optical microscope image of a processing area including the processing position at which the alignment mark is formed, and a scanning ion microscope (SIM) image acquired by FIB irradiation to the processing area, based on said alignment mark, and which detects the processing position on the superposed images,
    wherein said FIB equipment irradiates the processing position detected by said processing position detection unit with said FIB, so as to perform the said etching or deposition.

2. The FIB equipment according to claim 1, further comprising image pickup device for acquiring said optical microscope image, and wherein
    said stage is provided movably between said image pickup device and a FIB column in which said alignment mark formation unit and processing position detection unit are provided.

3. The FIB equipment according to claim 1, wherein, in response to specification of said processing position and a magnification of the processing area including the processing position, said alignment mark formation unit forms the alignment marks of a size and at an interval which are inversely proportional to said magnification.

4. The FIB equipment according to claim 3, wherein, when said magnification is low, the size of and the interval between said alignment marks are large, and when said magnification is high, the size of and the interval between the alignment marks are small, in inverse proportion to the magnification.

5. The FIB equipment according to claim 1, wherein said alignment mark is a protruding shape formed by depositing a pattern on the surface of said sample, or is a depression shape formed by etching the surface of said sample.

6. A focused ion beam (FIB) processing method, in which a sample placed on a stage is irradiated with an FIB, and etching or deposition is performed at the irradiated position, comprising:

an alignment mark formation process, in which said sample is introduced into FIB equipment, a and periphery of the processing position is irradiated with the FIB, so that an alignment mark is formed on the surface of said sample;

a processing position detection process, in which an optical microscope image of a processing area including the processing position, at which the alignment mark is formed, and a scanning ion microscope (SIM) image acquired by FIB irradiation to the processing area, are superposed based on said alignment mark, and the processing position is detected the superposed images; and, an FIB processing process, in which the processing position detected by said processing position detection process is irradiated with said FIB, so that said etching or deposition is performed.

7. The FIB processing method according to claim 6, wherein, in said alignment mark formation process, said processing position and a magnification of the processing area including the processing position are specified, and the alignment marks are formed with a size, and at an interval, inversely proportional to said magnification.

8. The FIB processing method according to claim 6, wherein said sample is an integrated circuit device having a multilayer wiring structure, and in said FIB processing process, a wiring pattern in said multilayer wiring structure is either broken or connected.

9. A computer program, executed by the control unit of focused ion beam (FIB) processing equipment which irradiates a sample placed on a stage with an FIB and performs etching or deposition at the irradiated position, comprising:

an alignment mark formation procedure, in which a periphery of a processing position on said sample introduced into said FIB processing equipment is irradiated with an FIB, and an alignment mark is formed on the surface of said sample; and, a processing position detection procedure, in which an optical microscope image of a processing area including the processing position at which the alignment mark is formed, is superposed with a scanning ion microscope (SIM) image acquired by FIB irradiation to the processing area, based on said alignment mark, and the processing position is detected on the superposed images.

10. A focused ion beam (FIB) processing method, in which an integrated circuit device placed on a stage is irradiated with an FIB, and etching or deposition is performed at the irradiated position, comprising:

an alignment mark formation process for forming, on the surface of said integrated circuit device, a plurality of alignment marks of prescribed size and at a prescribed interval;

a processing position detection process, in which an optical microscope image of a processing area including the processing position at which the alignment marks are formed, and a scanning ion microscope (SIM) image acquired by FIB irradiation to the processing area are superposed, based on said alignment mark, and the processing position is detected according to the superposed images; and, an FIB processing process, in which the processing position detected by said processing position detection process is irradiated by said FIB, and said etching or deposition is performed.

11. A focused ion beam (FIB) processing method, in which an integrated circuit device placed on a stage is irradiated with an FIB, and etching or deposition is performed at the irradiated position, comprising:

an alignment mark formation process for forming a plurality of alignment marks on the surface of said integrated circuit device, according to CAD data having said alignment marks, of a prescribed size and at a prescribed interval;

a processing position detection process, in which a CAD data image based on said CAD data for a processing area including the processing position at which the alignment marks are formed, is superposed with a scanning ion microscope (SIM) image acquired by FIB irradiation to the processing area, based on said alignment marks, and the processing position is detected on the superposed images; and, an FIB processing process, in which the processing position detected by said processing position detection process is irradiated with said FIB, so that said etching or deposition is performed.

12. The FIB processing method according to claim 10 or claim 11, wherein, in said alignment mark formation process, the size and interval of said alignment marks are set according to the fineness of a design rule of said integrated circuit device.

13. The FIB processing method according to claim 12, wherein, when the degree of fineness of the design rule is low, the size of and the interval between said alignment marks are large, and when the degree of the fineness is high, the size of and the interval between alignment marks are small, in proportion to the degree of the fineness.

14. The FIB processing method according to claim 10 or claim 11, wherein, in said alignment mark formation process, a chip center pattern is also formed at the chip center.

* * * * *